United States Patent [19]

Mizusawa et al.

[11] Patent Number: 4,999,506

[45] Date of Patent: Mar. 12, 1991

[54] POSITIONING MECHANISM

[75] Inventors: Nobutoshi Mizusawa, Yamato; Yutaka Tanaka, Yokohama; Ryuichi Ebinuma, Kawasaki, all of Japan

[73] Assignee: Canon Kabushiki Kaisha, Tokyo, Japan

[21] Appl. No.: 302,184

[22] Filed: Jan. 26, 1989

[30] Foreign Application Priority Data

Jan. 28, 1988 [JP] Japan .................... 63-015859

[51] Int. Cl.⁵ .................... G01N 21/00; H01J 1/00
[52] U.S. Cl. .................... 250/491.1; 250/492.1
[58] Field of Search .................... 250/491.1, 492.1

[56] References Cited

U.S. PATENT DOCUMENTS

| | | | |
|---|---|---|---|
| 3,300,618 | 1/1967 | Sciaky | 250/491.1 |
| 3,926,323 | 12/1975 | Frank et al. | 250/491.1 |
| 4,057,347 | 11/1977 | Moriyama et al. | 250/491.1 |
| 4,401,406 | 8/1983 | Rovira | 250/491.1 |
| 4,514,858 | 4/1985 | Novak | 250/491.1 |
| 4,528,576 | 7/1985 | Koumura et al. | 346/140 R |
| 4,669,867 | 6/1987 | Uda et al. | 355/53 |
| 4,676,630 | 6/1987 | Matsushita et al. | 355/53 |
| 4,677,448 | 6/1987 | Mizusawa et al. | 346/140 R |
| 4,749,867 | 6/1988 | Matsushita et al. | 250/442.1 |

*Primary Examiner*—Bruce C. Anderson
*Attorney, Agent, or Firm*—Fitzpatrick, Cella, Harper & Scinto

[57] ABSTRACT

A positioning device includes a movable table supported by a rectilinear guide mechanism or rotary mechanism, the movable table being moved by a driving mechanism so as to position a member, to be conveyed, placed on the movable table, with respect to a predetermined site. After the member being conveyed is conveyed to the predetermined site, the conveyed member intimately contacts a stationary table which provides a reference with respect to the attitude of the conveyed member, such that the attitude correction of the conveyed member is attained.

15 Claims, 10 Drawing Sheets

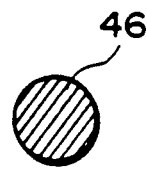
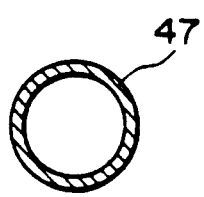
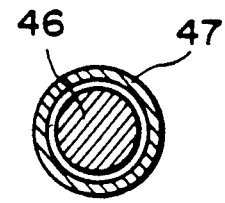
FIG. 2A
PRIOR ART
FIG. 2B
PRIOR ART
FIG. 2C
PRIOR ART
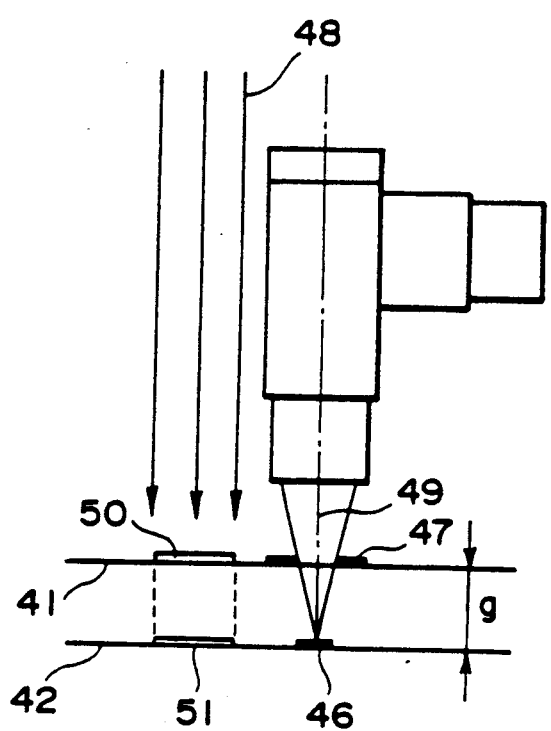
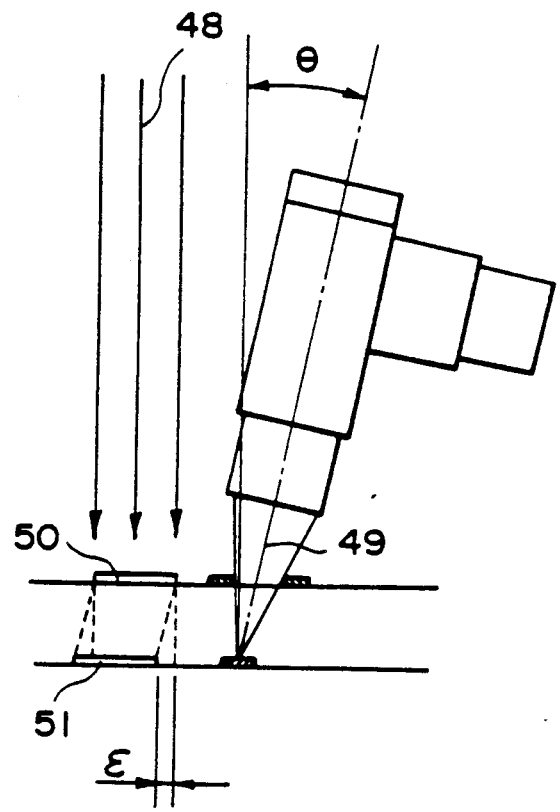
FIG. 3A
PRIOR ART
FIG. 3B
PRIOR ART

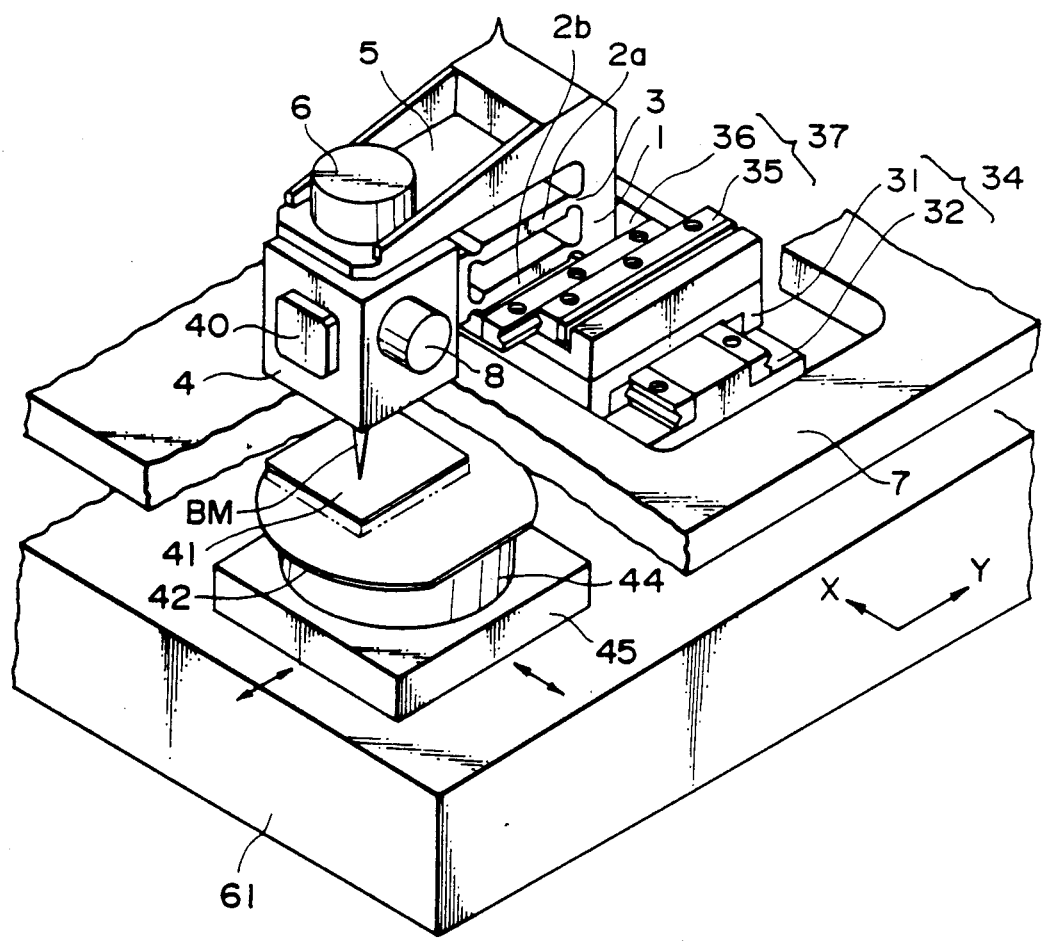
F I G. 4

POSITIONING MECHANISM

FIELD OF THE INVENTION AND RELATED ART

This invention relates to a positioning mechanism for moving, by a suitable driving means, a movable table which is supported by a rectilinear guide mechanism or rotary mechanism, to position a member, to be conveyed, placed on the movable table.

In many varieties of applications such as image processing devices, image recording devices, optical observation instruments, semiconductor microcircuit manufacturing apparatuses, and high-precision article assembling apparatuses, for example, such a mechanism for moving and positioning a member to be conveyed is used. One representative example of such a mechanism may include a structure provided by a combination of a cross roller guide, a linear encoder and a motor. The cross roller guide is a guide mechanism for moving an optical component or a recording member in one direction. The motor is a drive source for driving a movable table of the cross roller guide, the drive being transmitted through a transmission mechanism such as a gear means or ballscrew means. The linear encoder functions as a means for detecting the position of a member to be conveyed, an output signal therefrom being applied by means of a servo circuit to the motor to control the same to thereby position the member being conveyed.

An example of such a positioning system is shown in FIG. 1. This positioning system comprises a combination of a cross roller guide, a linear encoder and a motor and, in this example, the positioning system is used with an alignment unit which is operable to align a reticle and a wafer in a process for manufacturing semiconductor microcircuits.

In FIG. 1, denoted at 31 is a movable guide which is movable in an X direction. Denoted at 32 is a stationary guide which is fixed to a frame 33. These two guides together comprise a cross roller guide 34. Another stationary guide 35 and another movable guide 36 comprise a Y-direction cross roller guide 37 which is mounted on the movable guide 31 so that it extends in a direction perpendicular to the cross roller guide 34. These two cross roller guides 34 and 37 cooperate to provide an X-Y stage. Motors for driving these movable guides as their well as associated linear encoders (position detecting means) are provided, but they are not illustrated in FIG. 1.

Mounted on the movable guide 36 is an alignment unit which comprises a laser tube (light source) 38, an alignment optical system 39 and an alignment signal detecting sensor 40. A reticle 41 has a pattern to be printed on a wafer 42, which pattern may be formed on the reticle by an electron beam drawing apparatus. The reticle 41 is supported by a reticle holder 43 so that a gap g is defined between it and the wafer 42. The wafer 42 is held by a wafer chuck 44 by attraction, and can be moved and positioned in the X and Y directions by means of a wafer stage 45.

An alignment mark such as shown at 46 in FIG. 2A is formed on the wafer 42, while an alignment mark such as shown at 47 in FIG. 2B is formed on the reticle 41. These marks can be detected by the alignment unit, by using a laser beam, for example. The wafer stage 45 is displaced so that these marks 46 and 47 as detected are brought into a positional relationship such as illustrated in FIG. 2C. After completion of reticle-to-wafer alignment, the exposure of the wafer to the pattern of the reticle is made by using a radiation energy supplied from suitable source, not shown.

By means of the cross roller guide means of the X-Y stage as described, the alignment unit can be moved and positioned at a desired site with respect to the reticle 41. As a result, irrespective of the position of an alignment mark which is changeable with the size of a pattern, a process to be performed, etc., and the reticle-to-wafer alignment using the alignment unit is attainable.

SUMMARY OF THE INVENTION

However, such a positioning system involves some disadvantages.

Referring to FIGS. 3A and 3B which are schematic representations of a mark detecting operation using the alignment unit shown in FIG. 1. FIG. 3A illustrates the case where the axis 49 of an alignment beam is parallel to the axis 48 of an exposure beam (light used for the photoprinting). FIG. 3B illustrates the case where the axis 49 of the alignment beam is inclined by the angle $\theta$ with respect to the axis 48 of the exposure beam.

In both cases of the FIG. 3A example and the FIG. 3B example, patterns of alignment completion, such as is illustrated in FIG. 2C, can be sensed by the alignment detecting sensor 40. Since in the FIG. 3A example the axis 48 of the exposure beam and the axis 49 of the alignment beam are parallel to each other, a pattern 50 of the reticle 41 can be superposed, by exposure, upon a pattern 51 having been formed on the wafer 42, without an overlay error. In the FIG. 3B example, however, since the axis 49 of the alignment beam is inclined by $\theta$ with respect to the axis 48 of the exposure beam, the completion of the reticle-to-wafer alignment as sensed by the alignment detecting sensor 40 causes an overlay error $\epsilon$ between the patterns 50 and 51. Thus, if the exposure is made in this state, there is produced an overlay error $\epsilon$ between the pattern 51 having been formed on the wafer 42 and a pattern just transferred onto the wafer by the exposure. Where the gap between the wafer 42 and the reticle 41 is denoted by g, the error $\epsilon$ is equal to $g \cdot \tan\theta$.

The tilt of the axis 49 of the alignment beam may result from a change in attitude of the X-Y stage supporting the alignment unit, particularly, from the pitching and/or rolling of the X-Y stage. This problem of the error $\epsilon$ resulting from the change in attitude of the X-Y stage, as described above, is particularly disadvantageous in consideration view of the trend of further miniaturization and higher density in recent LSI microcircuit devices, which requires high precision-alignment.

The change in the attitude of an X-Y stage comprising a cross roller guide means may be caused by waviness of a rolling surface along which rollers move, the straightness of a guide, irregularity in the thickness of an oil film, the presence of foreign particles, etc. Particularly when foreign particles are present, it is difficult to remove them, and, therefore, it is difficult to assure good precision reproducibility.

It is accordingly an object of the present invention to provide a positioning system suitably usable for the positioning of an alignment unit of a semiconductor microcircuit manufacturing exposure apparatus, for example, wherein a member to be conveyed can be moved and positioned at a desired site without any change in its attitude which may be caused by the effect of a conveying means conveying the member to be conveyed.

In accordance with one aspect of the present invention, after movement by a conveying means, a member having been conveyed contacts intimately to a predetermined reference surface. This allows the conveyed member to be held in a desired attitude with certainty and with high precision, without being affected by the precision of a moving mechanism, a guiding mechanism, etc., of the conveying means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A–2C are schematic illustrations of alignment marks and their state upon completion of alignment.

FIGS. 3A and 3B are schematic illustrations for explicating the inconveniences involved in the FIG. 1 example.

FIG. 4 is a fragmentary perspective view of a reticle-to-wafer alignment system according to a first embodiment of the present invention.

DESCRIPTION OF THE PREFERRED EMBODIMENTS

Figure 5:
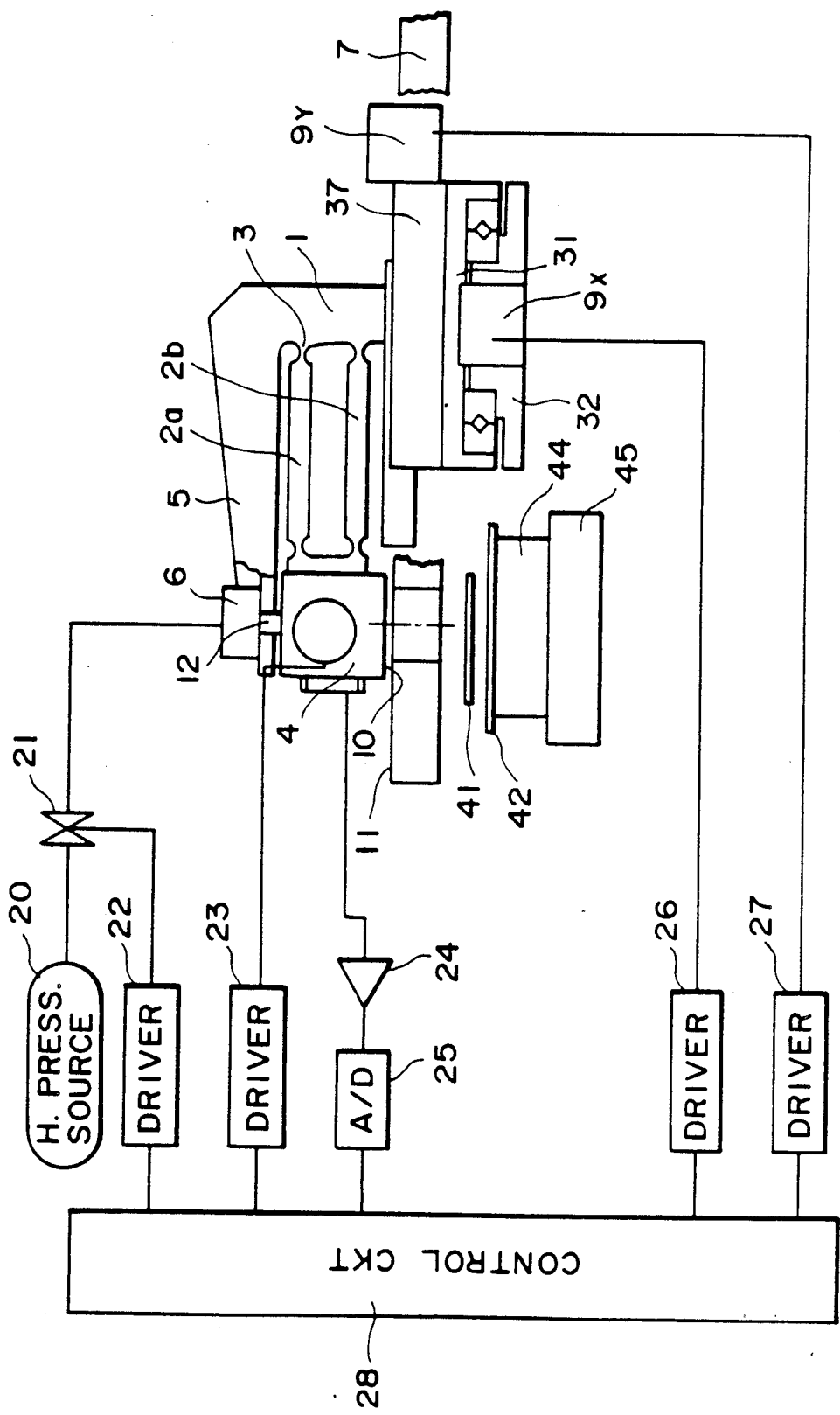
FIG. 5 is a schematic and diagrammatic view, partially in section, showing a major portion of the FIG. 4 embodiment.

FIG. 4 is a perspective view of a positioning system according to an embodiment of the present invention, which embodiment is applied to a semiconductor microcircuit device manufacturing exposure apparatus. FIG. 5 is a side view, partially in section, schematically and diagrammatically showing a major portion of the FIG. 4 embodiment.

In FIG. 4, denoted at 61 is a surface plate (base member) on which a wafer stage 45, a cross roller guide means, etc. are placed. Denoted at 1 is a post which is fixedly secured to a movable guide 36 of a Y-direction cross roller guide 37. To this post 1, two parallel linkage plates 2a and 2b are coupled by means of a resilient hinges 3. The other ends of the linkage plates 2a and 2b are coupled to an alignment unit 4 by means of similar resilient hinges 3 to resiliently support the alignment unit 4. Provided at the top of the post 1 is a frame 5 which extends up to the top of the alignment unit 4. The frame 5 supports thereon an actuator 6 such as an air-cylinder of short stroke, for moving the alignment unit 4 upwardly and downwardly. The air-cylinder 6 used in this embodiment not only functions to move the alignment unit 4 upwardly and downwardly, but also acts as a clamp means for pressing, with a certain pressure, the alignment unit 4 against a stage base table 7 having a surface whose flatness has been machined with high precision. While the exposure apparatus in which the described positioning system is employed includes a radiation energy source for exposure of a wafer 42 as well as other constitutional elements, they are not illustrated in the drawings.

Figure 1:
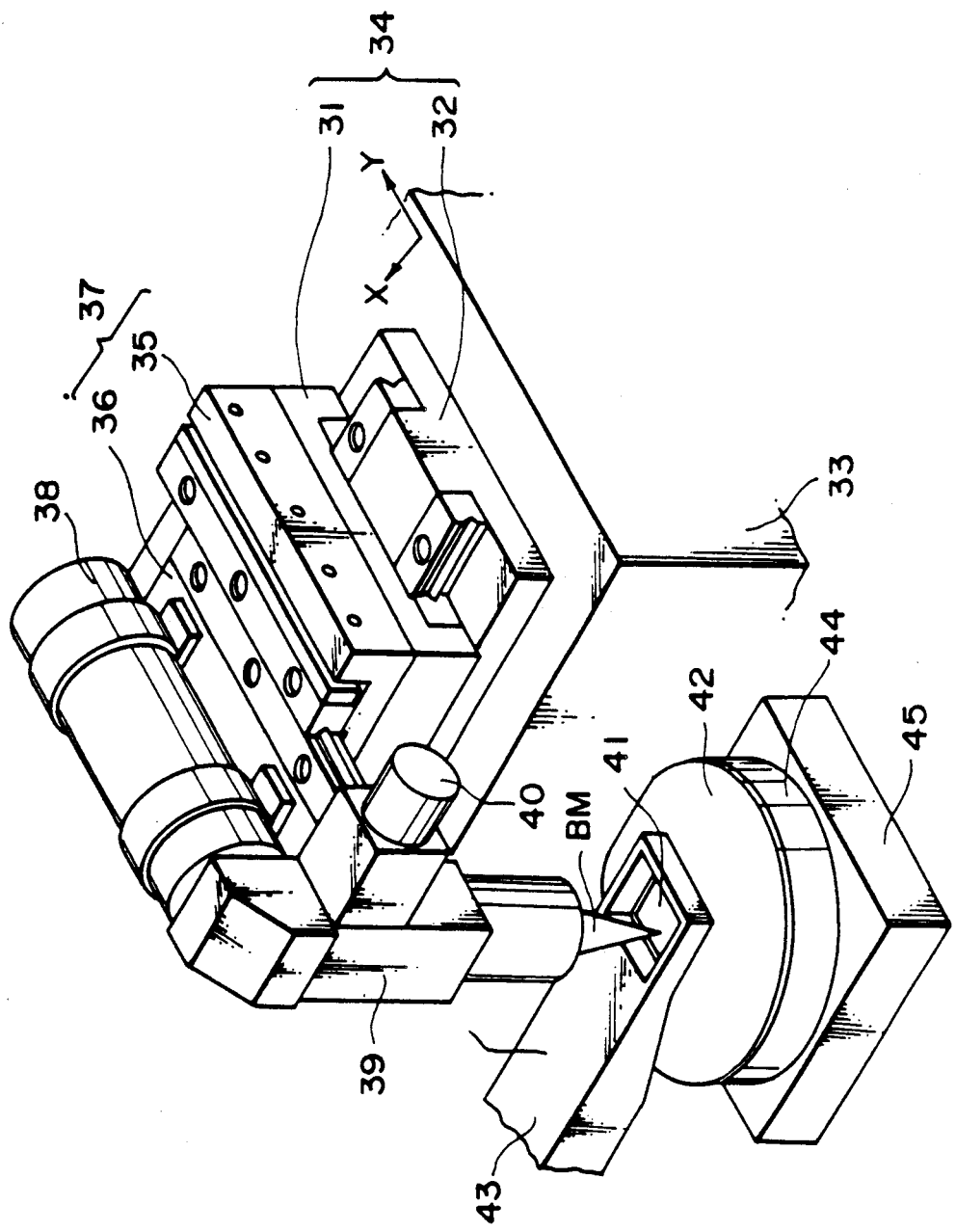
FIG. 1 is a fragmentary perspective view of a known type reticle-to-wafer alignment system.

The alignment unit 4 comprises a light source 8 which may be a semiconductor laser, an alignment signal detecting sensor 40 and an alignment optical system (not shown). Similar to the FIG. 1 example, the alignment unit 4 is operable to detect an alignment mark formed on a reticle 41 (such as at 47 in FIG. 2B) as well as an alignment mark formed on a wafer 42 (such as at 46 in FIG. 2A). In accordance with the detection of these marks, the wafer stage 45 is displaced so that a pattern of the reticle (such as at 50 in FIG. 3A) can be correctly superposed upon a pattern having been formed on the wafer (such as at 51 in FIG. 3A).

In FIG. 5, the positioning system includes two actuator units 9X and 9Y for driving the X-Y stage in the X and Y directions. Each actuator unit comprises a motor rotatable in accordance with an instruction voltage supplied from a controller (central processing unit) 28, a rotary encoder for detecting the amount of rotational motion of the motor, and a transmission mechanism for converting the rotational motion of the motor into a rectilinear motion and transmitting the same to the movable guide 36. The positioning system further includes a high-pressure air source 20 for supplying high-pressure air to the air-cylinder 6; a solenoid valve 21 for adjusting the quantity of the high-pressure air to be supplied from the source 20 to the air-cylinder 6; a driver 22 for actuating the solenoid valve 21; an LD driver 23 for actuating the semiconductor laser 8 (alignment light source); an amplifier 24 for amplifying a signal as detected by the alignment signal detecting sensor 40; an analog-to-digital converter 25 for converting an analog output of the amplifier 24 into a digital signal; drive sources 26 and 27 for supplying drive signals to the actuator units 9X and 9Y, respectively; and a controller (central processing unit) 28 which is operable to control the drivers 22, 23, 26 and 27, for example, as well as to process an alignment detecting signal from the sensor, for example.

The bottom surface 10 of the alignment unit 4 and the top surface 11 of the stage base table 7, opposed thereto, each has been finished by superflatness machining. Also, the stage base table 7 is fixedly secured to the surface plate of the exposure apparatus.

Figure 7:
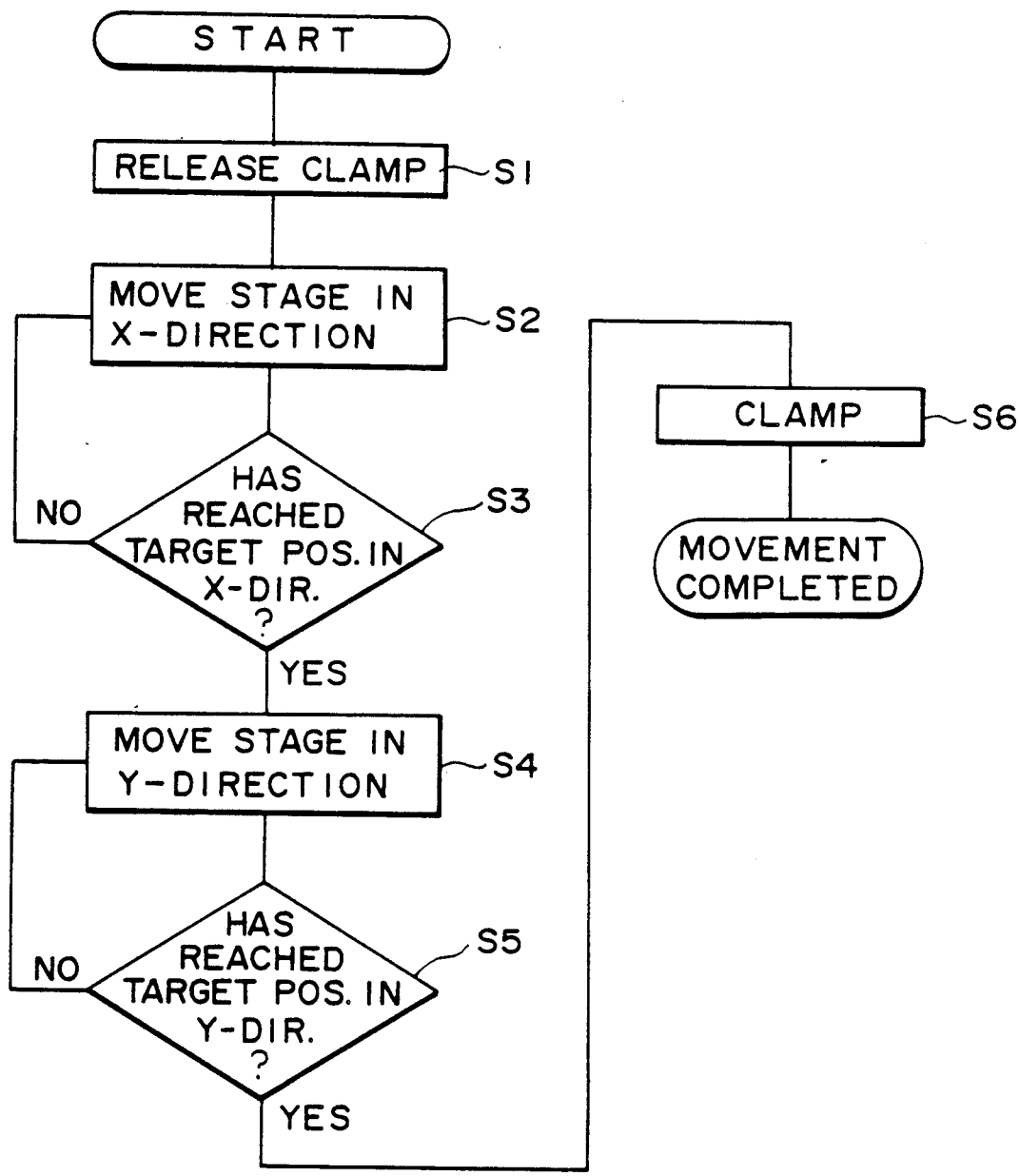
FIG. 7 is a flow chart showing the sequential operation made in the FIG. 4 embodiment.

The manner in which the alignment unit 4 is displaced to a predetermined site will now be explained, in conjunction with FIG. 5 and the flow chart of FIG. 7.

Figure 6A:
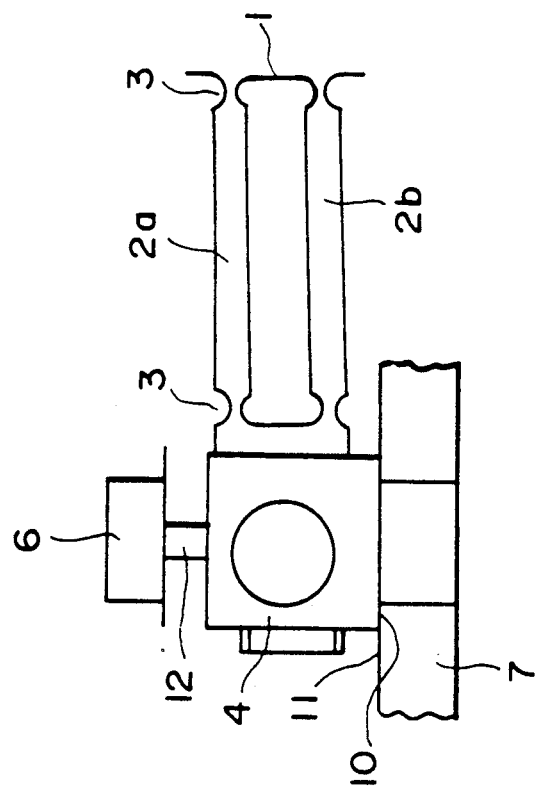
FIGS. 6A and 6B are representations for explicating the operation of the FIG. 4 embodiment.

Prior to the displacement, the air-cylinder 6 is brought into an extracted state so that the alignment unit 4 is lifted by a rod 12, with the result that the alignment unit 4 is disengaged from the stage base table 7 as illustrated in FIG. 6A (Step 1). The amount of floating is restricted by the shape of each resilient hinge 3, the length of each linkage plate 2a or 2b, as well as the materials of which these components are composed.

In the state in which the alignment unit 4 floats, the X-Y stage operates in response to an instruction signal from the controller to displace the alignment unit 4 to the predetermined site (Steps 2–5).

Figure 6B:
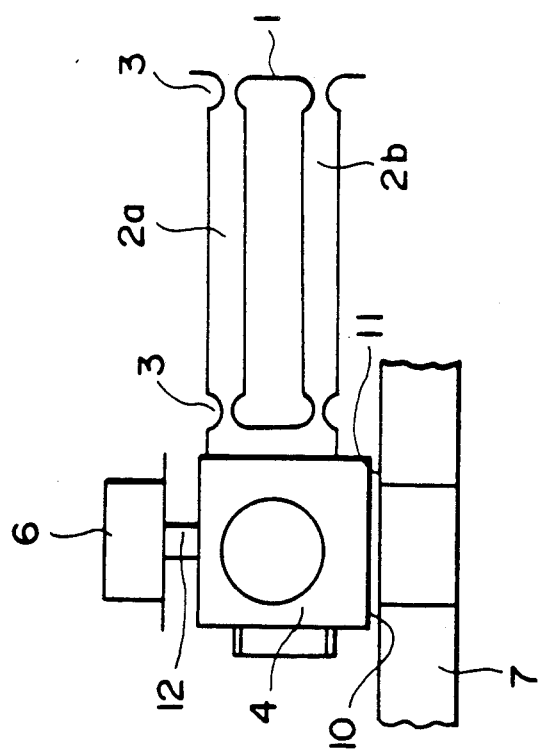

Subsequently, the air-cylinder 6 is brought into an extended state so that the alignment unit 4 is pressed downwardly by the rod 12, whereby the alignment unit 4 contacts intimately to the stage base table 7, as shown in FIG. 6B (Step 6). At this time, since each of the bottom surface 10 of the alignment unit 4 and the top surface 11 of the stage base table 7 has been finished by super-flatness machining, the alignment unit can be brought into and held in a surely constant attitude and the alignment can be made in this attitude of the alignment unit. In an X-Y stage mechanism using an ordinary cross roller guide, the highest attitude precision is about $1.5 \times 10^{-4}$ rad because of the difficulty in avoiding pitching or rolling. As compared therewith, in accordance with the present invention, the attitude precision can be determined by the machining precision of these two surfaces, and a highest attitude precision of about $0.3 \times 10^{-4}$ rad is attainable.

The stage base table 7 is formed with an opening, as best seen in FIG. 5, to allow the light from the alignment light source 8 of the alignment unit 4 as well as the light reflected from the marks of the reticle and the wafer to pass therethrough toward the sensor 40, when the alignment unit 4 contacts intimately to the stage base table 7. That is, when the alignment unit 4 is moved downwardly, the bottom surface 10 of the alignment unit 4 engages the top surface 11 of the stage base table 7 around the opening formed therein.

The stage base table 7 is formed so as not to interfere with the exposure region (path of the exposure light). For example, the stage base plate 7 may have an opening so that the exposure light can pass therethrough.

In accordance with the present embodiment, as described hereinbefore, the alignment unit 4 can be positioned with high attitude precision. As a result, no tilt of the axis of alignment beam occurs and, therefore, high-precision alignment is attainable.

Figure 13:
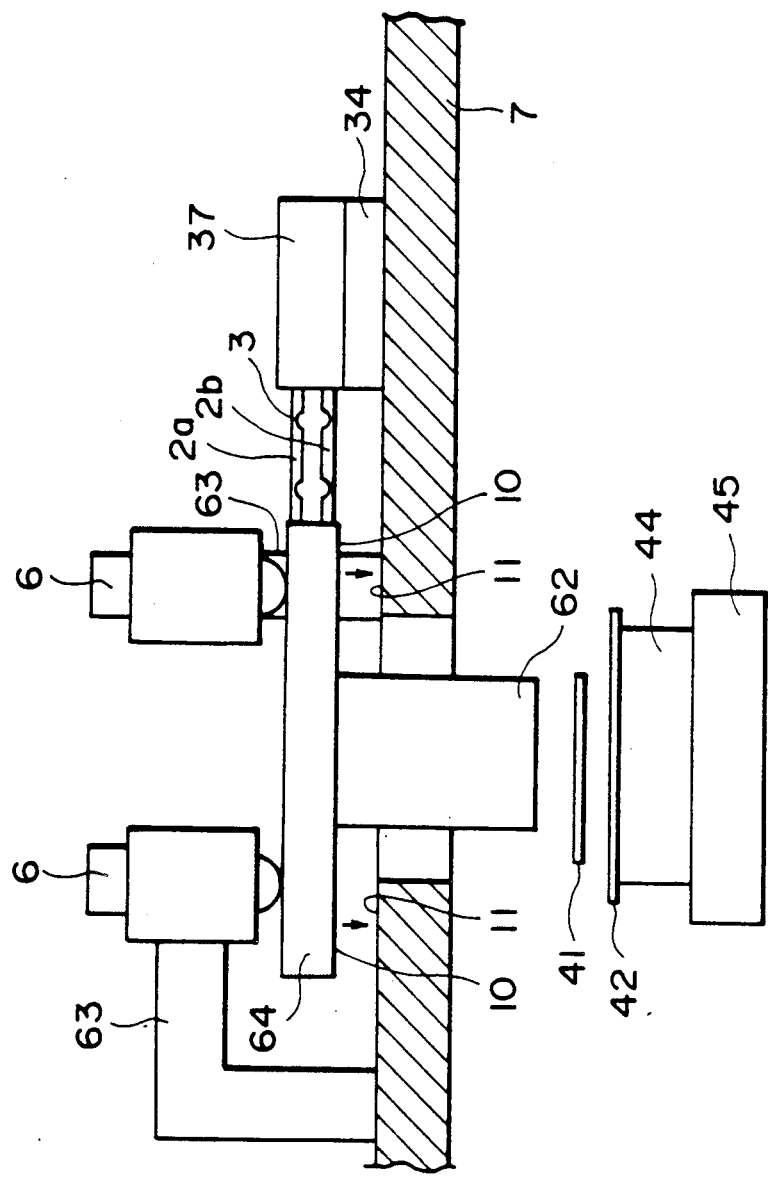
FIG. 13 is a schematic view, partially in section, showing a reticle-to-wafer alignment system according to a third embodiment of the present invention.

In the present embodiment, the alignment unit itself which is a member to be conveyed by the cross roller guide means engages the reference surface formed on a stationary table for the attitude correction. However, the invention is not limited to such a form. For example, as illustrated in FIG. 13, the attitude correction of an alignment unit at a desired site can be made by specifically arranging a portion other than the alignment unit. This will be described below in more detail.

In FIG. 13 which shows another embodiment, reference numerals the same as those used in the foregoing embodiment are assigned to similar or corresponding elements. Denoted at 62 is an alignment pickup head which is a member to be conveyed. Denoted at 63 are posts adapted to support clamp means 6. Denotes at 64 is a movable table on which the pickup head 62 is placed and supported. An X-Y stage mechanism having movable tables 34 and 37 is operable to displace the movable table 64 to move the pickup head 62, supported by the movable table 64, to position the pickup head 62 relative to a reticle 41 and a wafer 42. The clamp means 6 is operable to selectively urge the movable table 64 so that a reference surface 10 of the movable table is pressed against a reference surface 11 of the stage base table 7, such that the movable table 64 is clamped. After the clamping is accomplished, the reticle-to-wafer alignment is made with the corrected attitude of the pickup head 62. In this embodiment, as described above, the attitude correction of the alignment unit or head can be made by the engagement of the movable table 64 which may be considered as another member to be conveyed.

In this embodiment, the floating action of the alignment unit or head is restricted by a parallel linkage using similar resilient hinge means 3. As a result, there is no play due to a bearing gap, which may be caused in the case where the linkage uses an ordinary hinge means. Also, for the floating, the alignment unit can float from and land on an opposing surface with a small attitude change and with high reproducibility. Additionally, there is no possibility of creation of foreign particles at the hinge portion.

Figure 8:
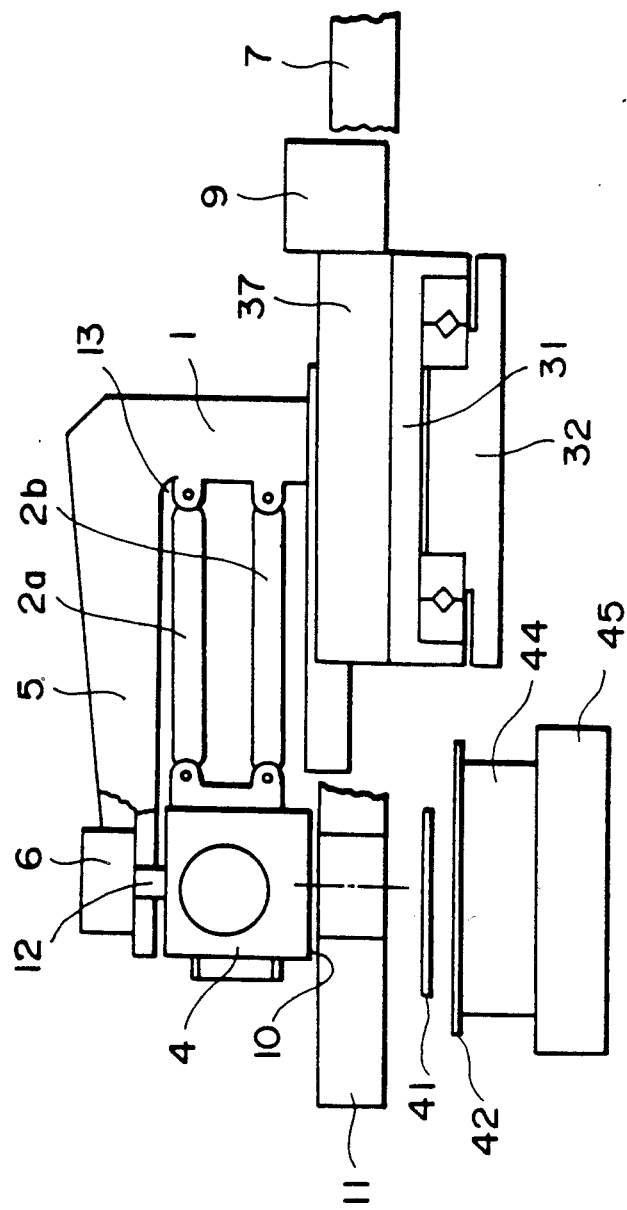
FIG. 8 is a fragmentary side view, partially in section, showing a major portion of a reticle-to-wafer alignment system according to a second embodiment of the present invention.

In the foregoing embodiments, the parallel linkage provided by resilient hinges and linkage plates may be replaced by a parallel leaf spring means comprising two or more leaf springs. Substantially the same effect is attainable with this embodiment.

Where very high reproducibility or prevention of dust creation is not required, use may be made of a parallel linkage provided by hinge means 13 and linkage plates 2a and 2b such as shown in FIG. 8.

Also, in the above-described embodiments, an alignment unit 4 which is a member to be conveyed is moved while being floated from a stage base table 7. As a result, there is substantially no possibility of the creation of dust at the portion adjacent the alignment unit. This is very desirable.

Figure 9:
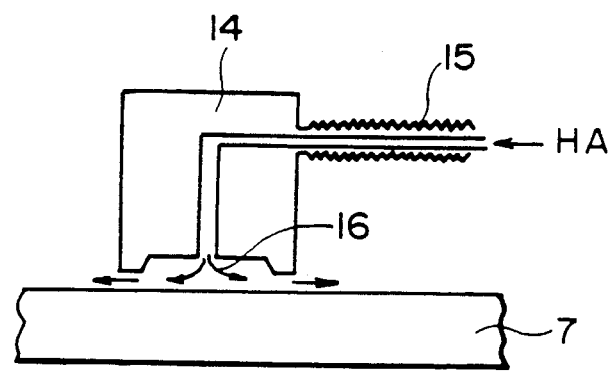
FIGS. 9–11 and 12A and 12B are schematic views, respectively, showing modified forms according to the present invention.
Figure 10:
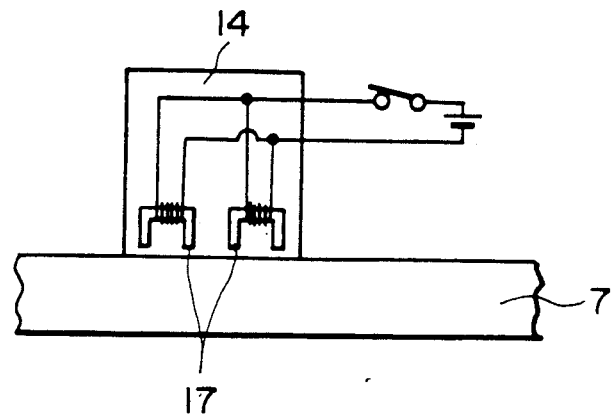

In the foregoing embodiments, an air-cylinder is used as a means for floating the alignment unit 4. However, the present invention is not limited thereto. For example, as shown in FIG. 9, a high-pressure air HA may be supplied to a member 14, to be conveyed, through a flexible tube 15, such that the high-pressure air HA may be discharged from an orifice 16 provided in the bottom of the member 14 to float the member. In that case, for engagement of the member 14 with a stage base table 7, the supply of the high-pressure air may be stopped and, additionally, a vacuum attracting means such as a pump, for example, may be used to produce a negative pressure so that the member 14 may be attracted to and intimately contact the stage base table 7. In the case where, in some embodiments described hereinbefore, an air-cylinder is used to press the member, being conveyed, against the stage base table, there is a possibility that the pressing force causes flexure of the stage base table. However, in this form of the present invention shown in FIG. 9, no external force is directly applied to the stage base table, with an advantageous result of creation of no such flexure. Further, as illustrated in FIG. 10, a stage base table 7 may be made of a magnetic material and a member 14, having been conveyed, may intimately contact the stage base table 7 by means of an electromagnet 17 which may be provided in the neighborhood of the bottom of the member 14. Substantially the same advantageous effect is attainable in that case.

The foregoing description has been provided for examples in which a member to be conveyed floats from a stage base table upon conveyance. However, the invention is not limited to this, and the system may be so arranged that the member to be conveyed does not float upon conveyance. In an example shown in FIG. 11, a member 14 to be conveyed intimately contacts a stage base table 7 by the weight W thereof and, during conveyance, the member 14 is displaced while sliding on the surface of the stage base table 7. Where a reproducibility in respect to the intimate contact of the member 14 to the stage base table 7 is required at the time of stoppage, the pressing by an air-cylinder, the attraction by a pump means, the attraction by an electromagnet, etc., as in the foregoing examples, may be used.

Figure 11:
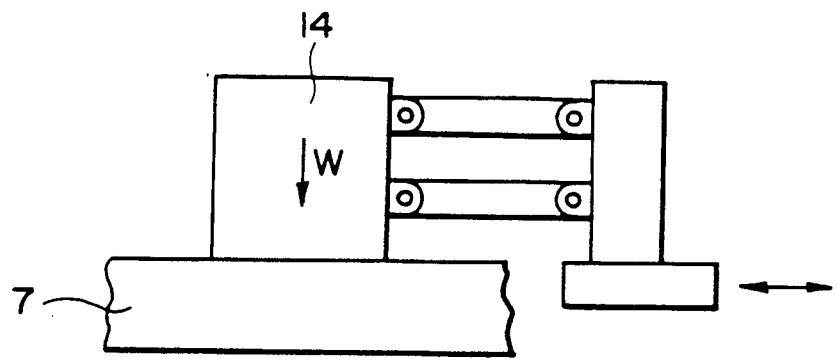

If, in the FIG. 11 example, the friction resistance or creation of foreign particles as a result of the sliding motion is quite undesirable, rolling means such as rollers may be used for the displacement to solve the problem.

Figure 12A:
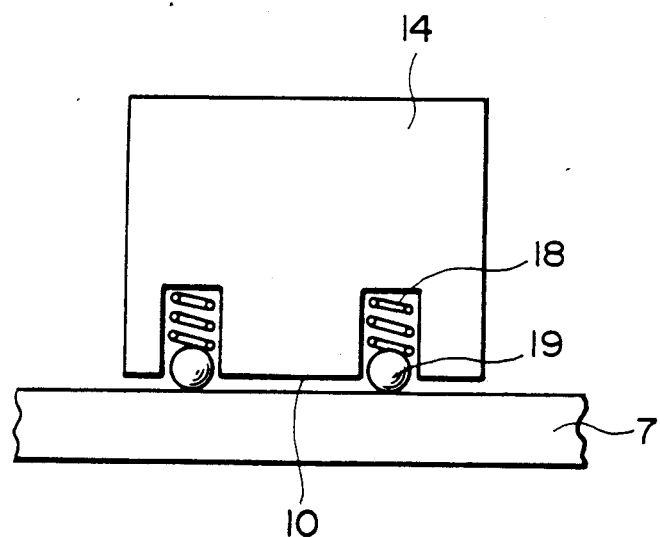
Figure 12B:
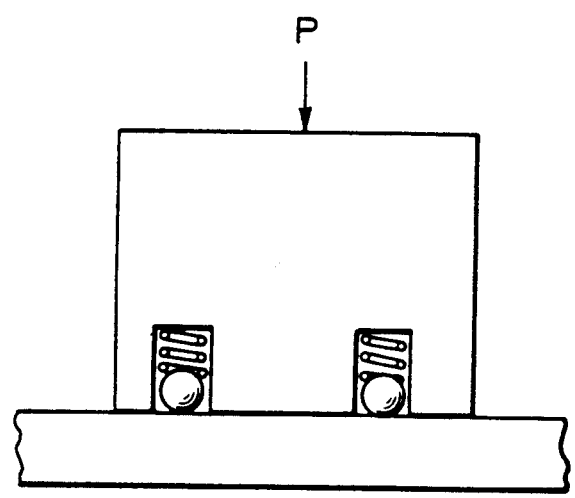

In an example shown in FIGS. 12A and 12B, steel balls 19 each being biased by a spring 18 are embedded in the bottom of a member 14 to be conveyed. Upon movement, the balls 19 roll along the surface of a stage base table 7 (FIG. 12A). At the time of positioning, on the other hand, a suitable pressing force P is applied to the member 14 from an air-cylinder or other means, so that the springs 18 are compressed and a flat surface portion 10 of the bottom of the member 14 intimately contacts the stage base table 7, whereby a desired attitude precision is attainable (FIG. 12B).

While the invention has been described with reference to the structures disclosed herein, it is not confined to the details set forth and this application is intended to cover such modifications or changes as may come within the purposes of the improvements or the scope of the following claims.

What is claimed is:

1. A positioning device, comprising:
a movable member;
a reference member;
a radiation sensor unit supported by said movable member for displacement relative to said movable member; and
attitude determining means for selectively displacing said radiation sensor unit relative to said movable member so as to bring said radiation sensor unit into contact with said reference member to determine the attitude of said radiation sensor unit in cooperation with said reference member.

2. A device according to claim 1, wherein said attitude determining means includes an cylinder for displacing said radiation sensor unit relative to said movable member.

3. A device according to claim 2, wherein said movable member comprises a resilient hinge for supporting said radiation sensor unit.

4. A device according to claim 3, wherein said radiation sensor unit includes a light source for producing light to be projected to a sample and a photosensor for receiving light from the sample.

5. A device according to claim 2, wherein said movable member comprises a parallel linkage for supporting said radiation sensor unit.

6. A device according to claim 5, wherein said radiation sensor unit includes a light source for producing light to be projected to a sample and a photosensor for receiving light from the sample.

7. A device according to claim 1, further comprising driving means for moving said movable member, wherein said radiation sensor unit is kept out of contact with said reference member when said movable member is moved by said driving means.

8. A device according to claim 1, further comprising driving means for moving said movable member, wherein said attitude determining means operates to bring said radiation sensor unit into intimate contact with said reference member after the movement of said movable member by said driving means is completed.

9. A device according to claim 8, wherein said radiation sensor unit is kept out of contact with said reference member when said movable member is moved by said driving means.

10. A positioning device, comprising:
a movable member;
a reference member having a reference surface;
a radiation sensor unit having a contact surface and being supported by said movable member; and
attitude determining means for selectively bringing said contact surface of said radiation sensor unit and said reference surface of said reference member into contact with each other so as to determine the attitude of said radiation sensor unit in cooperation with said reference member, to thereby fix the position of said radiation sensor unit with respect to the sensing by said radiation sensor unit.

11. A device according to claim 10, wherein each of said contact surface of said radiation sensor unit and said reference surface of said reference member has a predetermined surface precision so as to assure a constant attitude of said radiation sensor unit when said contact surface of said radiation sensor unit and said reference surface of said reference member are brought into contact with each other.

12. A device according to claim 11, further comprising driving means for moving said movable member with said radiation sensor unit, wherein said radiation sensor unit is kept out of contact with said reference member when said movable member is moved by said driving means.

13. An alignment and exposure apparatus for transferring a pattern of a mask onto a wafer, said apparatus comprising:
an alignment unit for producing information to be used for alignment of the mask and the wafer;
moving means for moving said alignment unit;
a reference member having a reference surface;
attitude determining means for selectively bringing said alignment unit into contact with said reference surface of said reference member so as to determine the attitude of said alignment unit in cooperation with said reference member, wherein said attitude determining means operates to bring said alignment unit into contact with said reference surface of said reference member after the movement of said alignment unit by said moving means is completed;
adjusting means for adjusting the relative position of the mask and the wafer on the basis of the information produced by said alignment unit; and
transfer means for transferring the pattern of the mask onto the wafer after adjustment by said adjusting means.

14. An apparatus according to claim 13, wherein said alignment unit is kept out of contact with said reference surface of said reference member when said alignment unit is moved by said moving means.

15. A positioning method usable in an alignment and exposure apparatus having an alignment unit, for transferring a pattern of a mask onto a wafer, said method comprising the steps of:
moving the alignment unit while keeping the alignment unit out of contact with a reference surface of a reference member of the exposure apparatus;
bringing the alignment unit into contact with the reference surface of the reference member after the movement of the alignment unit is completed, so as to determine the attitude of the alignment unit; and
generating information to be used in alignment of the mask and the wafer, through the alignment unit whose attitude has been determined by the contact with the reference surface of the reference member.

* * * * *

UNITED STATES PATENT AND TRADEMARK OFFICE
CERTIFICATE OF CORRECTION

PATENT NO. : 4,999,506
DATED : March 12, 1991
INVENTOR(S) : NOBUTOSHI MIZUSAWA ET AL.

It is certified that error appears in the above-identified patent and that said Letters Patent is hereby corrected as shown below:

COLUMN 1

Line 47, "as their well as" should read --as well as their--.

COLUMN 2

Line 2, "a" should be deleted.
Line 3, "from" should read --from a--.
Line 32, "by $\theta$" should read --by the angle $\theta$--.
Line 50, "consideration" should be deleted.

COLUMN 3

Line 5, "contacts intimately to" should read --intimately contacts--.

COLUMN 5

Line 4, "contacts intimately to" should read ---intimately contacts--.
Line 24, "contacts intimately to" should read ---intimately contacts--.
Line 52, "Denotes" should read --Denoted--.

COLUMN 6

Line 33, "member." should read --member 14.--.

UNITED STATES PATENT AND TRADEMARK OFFICE
CERTIFICATE OF CORRECTION

PATENT NO. : 4,999,506

DATED : March 12, 1991

INVENTOR(S) : NOBUTOSHI MIZUSAWA ET AL.

It is certified that error appears in the above-identified patent and that said Letters Patent is hereby corrected as shown below:

COLUMN 7

Line 36, "an" should read --a--.

Signed and Sealed this

Eighth Day of December, 1992

Attest:

DOUGLAS B. COMER

Attesting Officer

Acting Commissioner of Patents and Trademarks